United States Patent
Anderson et al.

(10) Patent No.: US 9,882,048 B2
(45) Date of Patent: Jan. 30, 2018

(54) GATE CUT ON A VERTICAL FIELD EFFECT TRANSISTOR WITH A DEFINED-WIDTH INORGANIC MASK

(71) Applicant: International Business Machines Corporation, Armonk, NY (US)

(72) Inventors: Brent A. Anderson, Jericho, VT (US); Sivananda K. Kanakasabapathy, Niskayuna, NY (US); Jeffrey C. Shearer, Albany, NY (US); Stuart A. Sieg, Albany, NY (US); John R. Sporre, Albany, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/197,996

(22) Filed: Jun. 30, 2016

(65) Prior Publication Data

US 2018/0006150 A1    Jan. 4, 2018

(51) Int. Cl.
| | |
|---|---|
| H01L 29/78 | (2006.01) |
| H01L 29/66 | (2006.01) |
| H01L 21/033 | (2006.01) |
| H01L 21/3065 | (2006.01) |
| H01L 21/02 | (2006.01) |
| H01L 29/49 | (2006.01) |

(52) U.S. Cl.
CPC ...... *H01L 29/7827* (2013.01); *H01L 21/0217* (2013.01); *H01L 21/0337* (2013.01); *H01L 21/3065* (2013.01); *H01L 29/495* (2013.01); *H01L 29/66666* (2013.01); *H01L 29/66795* (2013.01); *H01L 29/785* (2013.01)

(58) Field of Classification Search
CPC ............. H01L 29/7827; H01L 21/0217; H01L 21/0337; H01L 21/3065; H01L 29/495; H01L 29/66666; H01L 29/66795; H01L 29/785
USPC ........................................................ 257/329
See application file for complete search history.

(56) References Cited

U.S. PATENT DOCUMENTS

| | | |
|---|---|---|
| 6,724,031 B1 | 4/2004 | Akatsu et al. |
| 8,786,004 B2 | 7/2014 | Park et al. |
| 8,932,961 B2 | 1/2015 | Mehta et al. |
| 9,177,796 B2 | 11/2015 | Bencher et al. |

(Continued)

*Primary Examiner* — Hrayr A Sayadian
(74) *Attorney, Agent, or Firm* — Cantor Colburn LLP; Vazken Alexanian

(57) ABSTRACT

A method of cutting a gate on a VFET includes depositing a memorization layer around a spacer on a sidewall of the field effect transistor. A planarizing layer is patterned onto the memorization layer. An anti-reflective coating layer is patterned onto the planarizing layer. A photoresist layer is patterned onto the anti-reflective coating layer on ends of fins extending from a substrate. The planarizing layer, the anti-reflective coating layer, and the photoresist form a mask. The anti-reflective coating layer portion is etched from the VFET. The planarizing layer and the photoresist layer are arc etched from the VFET. The spacer is pulled down forming a void between gates on the VFET and exposing a hard mask on the fins. The hard mask is reactive ion etched vertically around the gates to form gates with a defined width mask. The memorization layer is removed from the VFET.

12 Claims, 12 Drawing Sheets

(56) References Cited

U.S. PATENT DOCUMENTS

| | | |
|---|---|---|
| 9,224,842 B2 | 12/2015 | Bouche et al. |
| 9,305,785 B2 | 4/2016 | Wei et al. |
| 2014/0239415 A1* | 8/2014 | Basker ................ H01L 21/8238 257/402 |
| 2016/0042969 A1 | 2/2016 | Mohanty |
| 2016/0071774 A1 | 3/2016 | Wei et al. |
| 2016/0079242 A1 | 3/2016 | Bouche et al. |

* cited by examiner

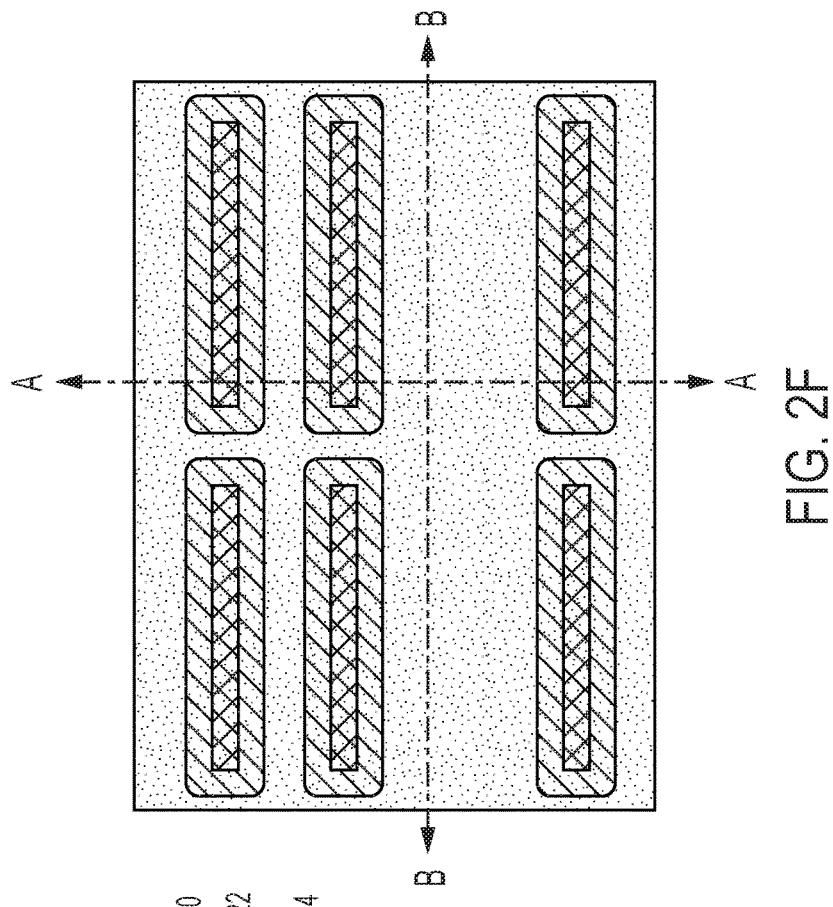
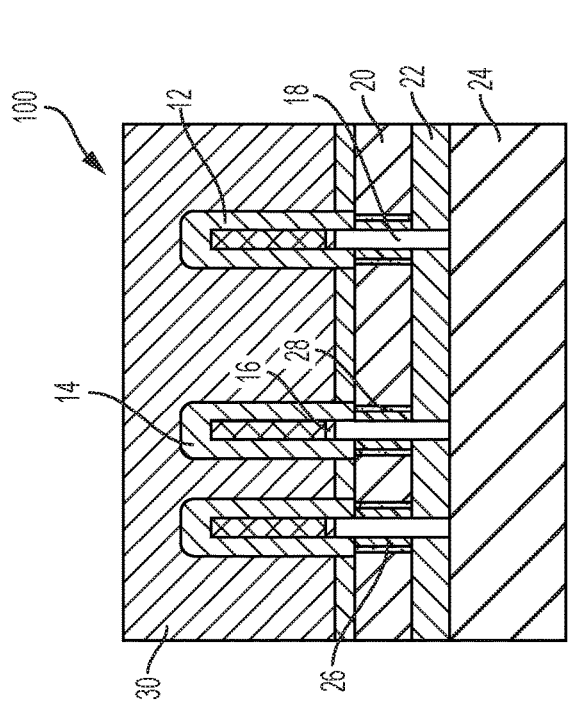
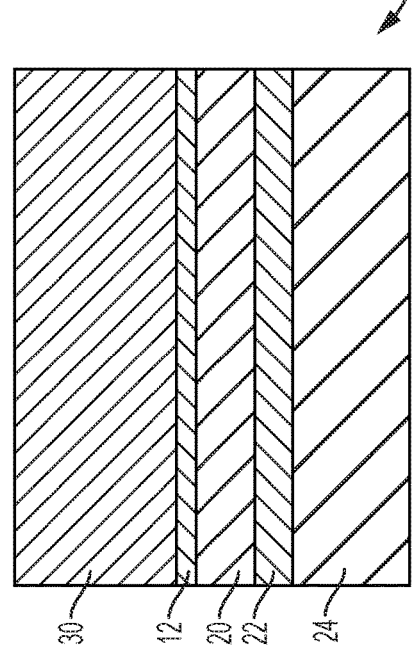

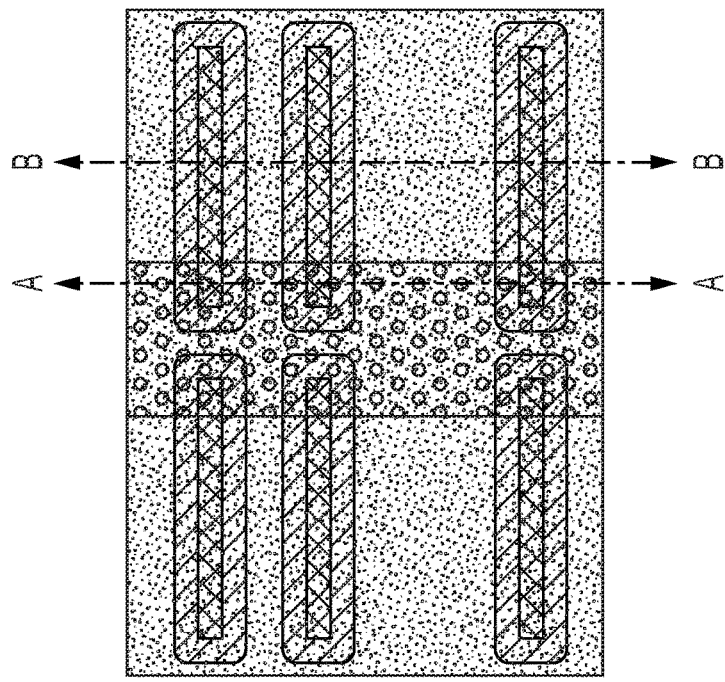
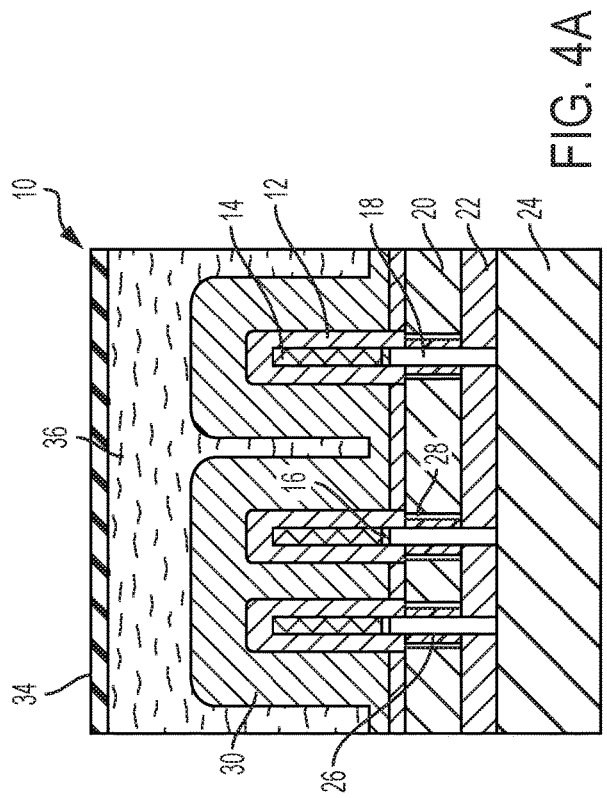
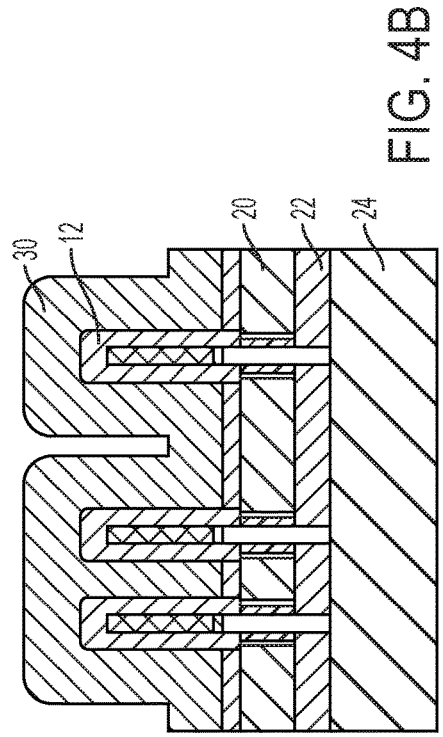
FIG. 4A
FIG. 4B
FIG. 4C

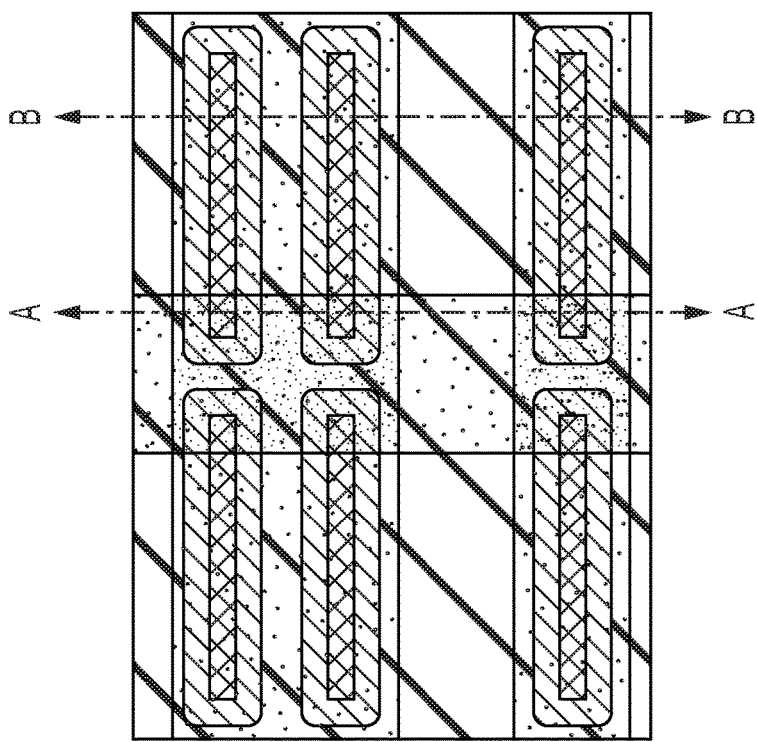
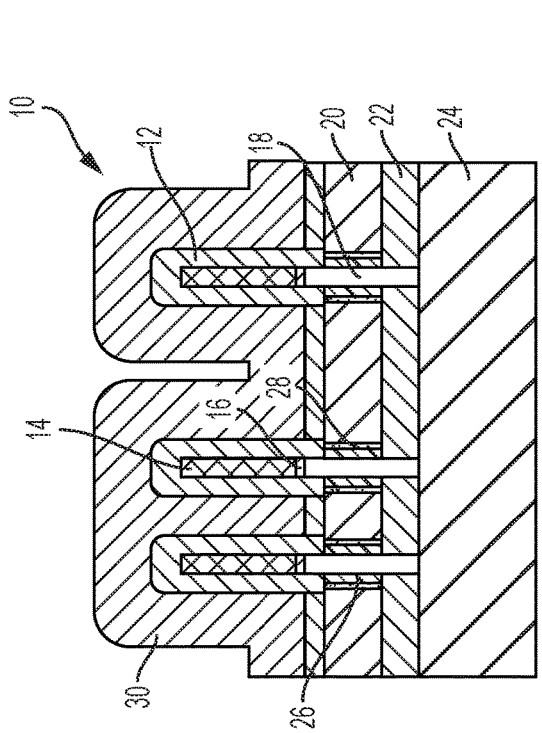
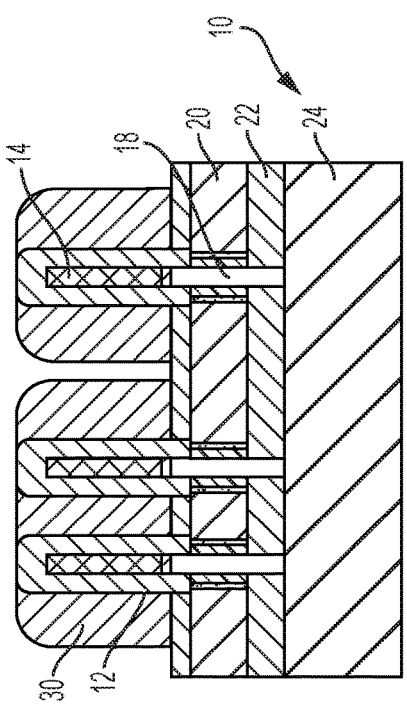
FIG. 5C
FIG. 5A
FIG. 5B

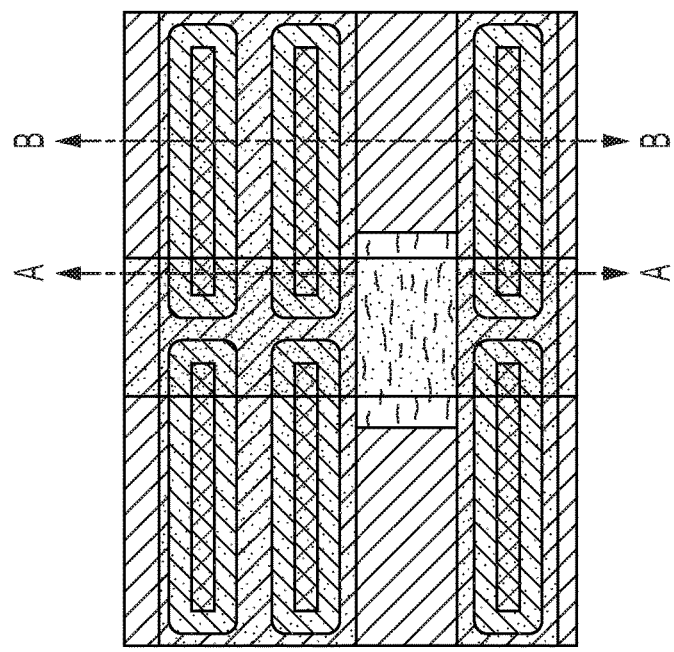
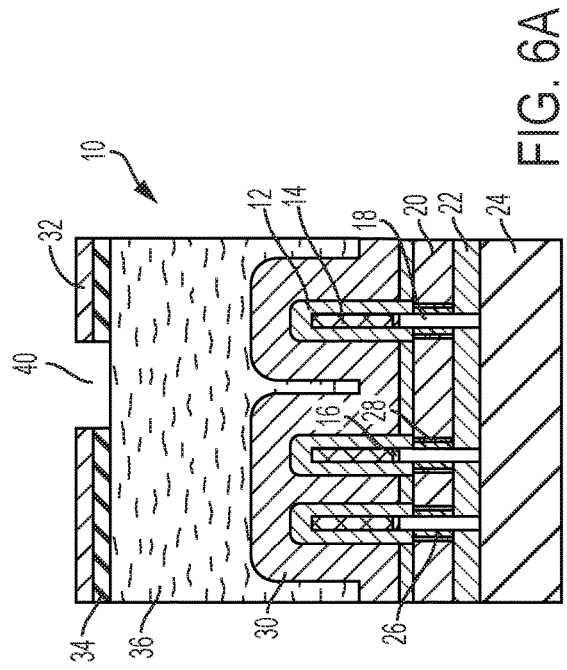
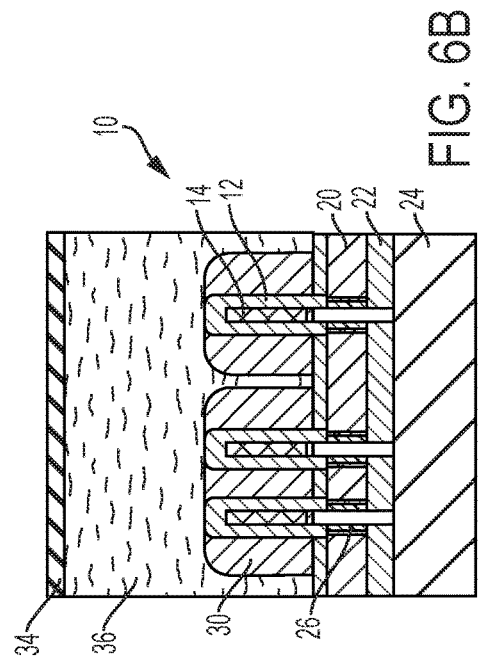

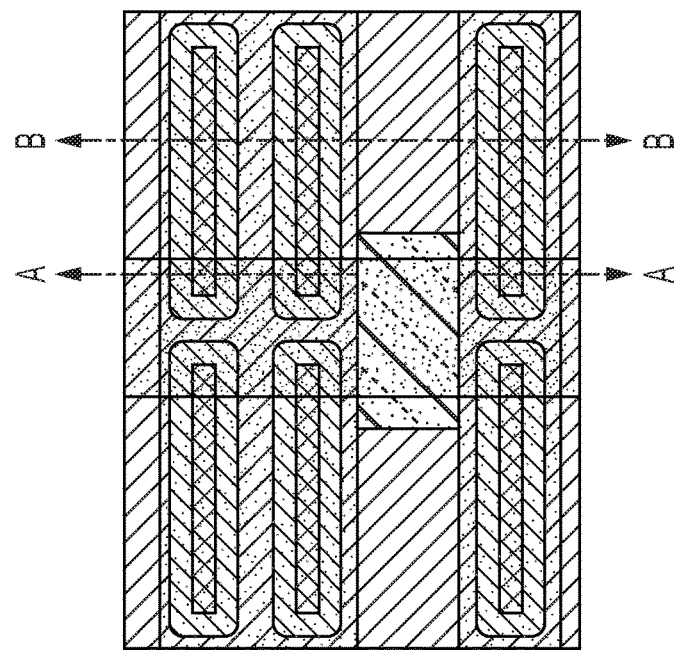
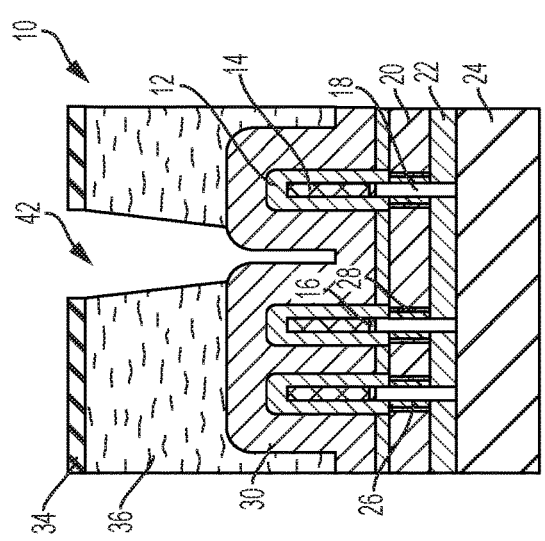
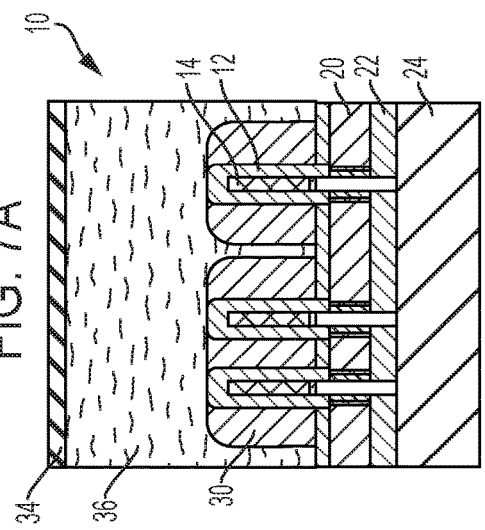

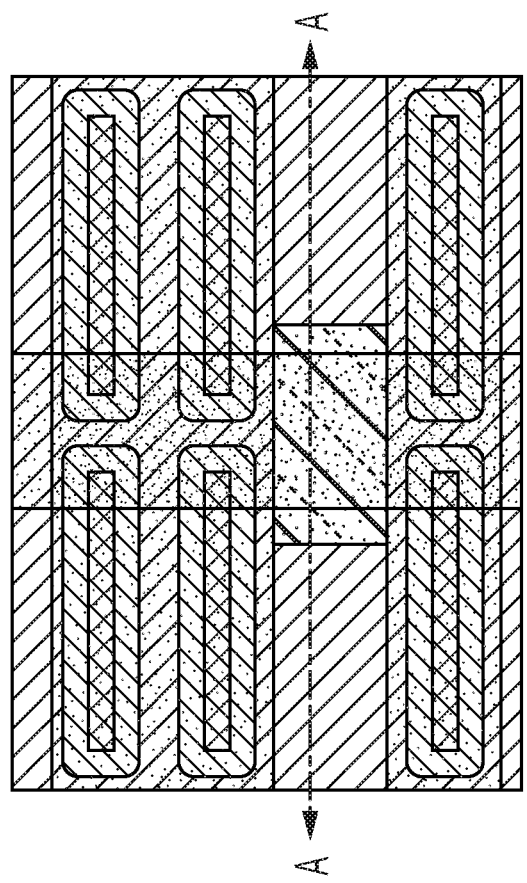
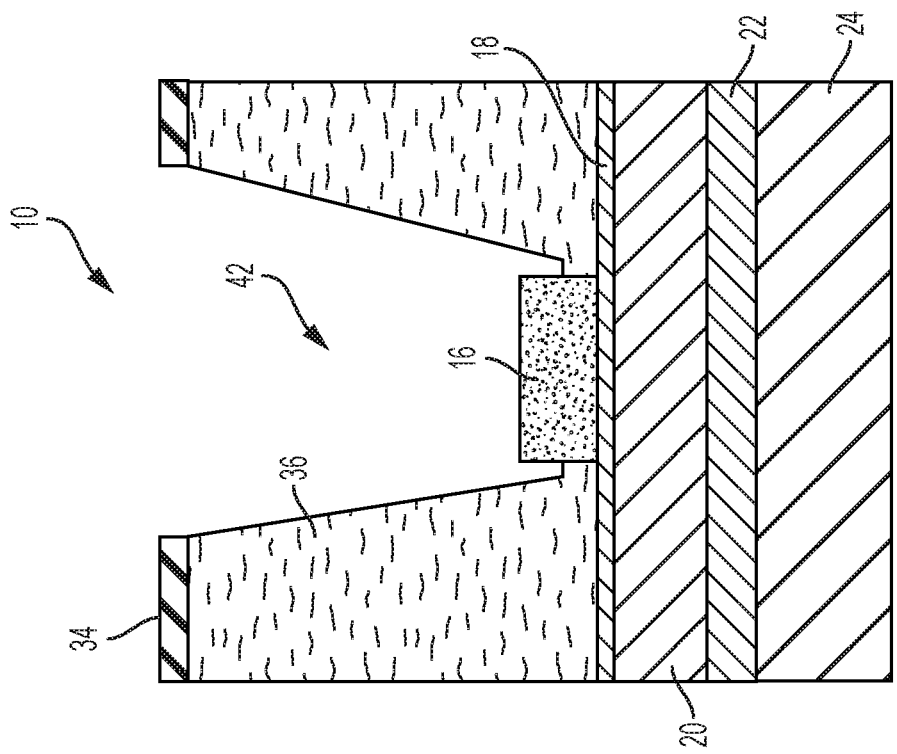
FIG. 8B
FIG. 8A

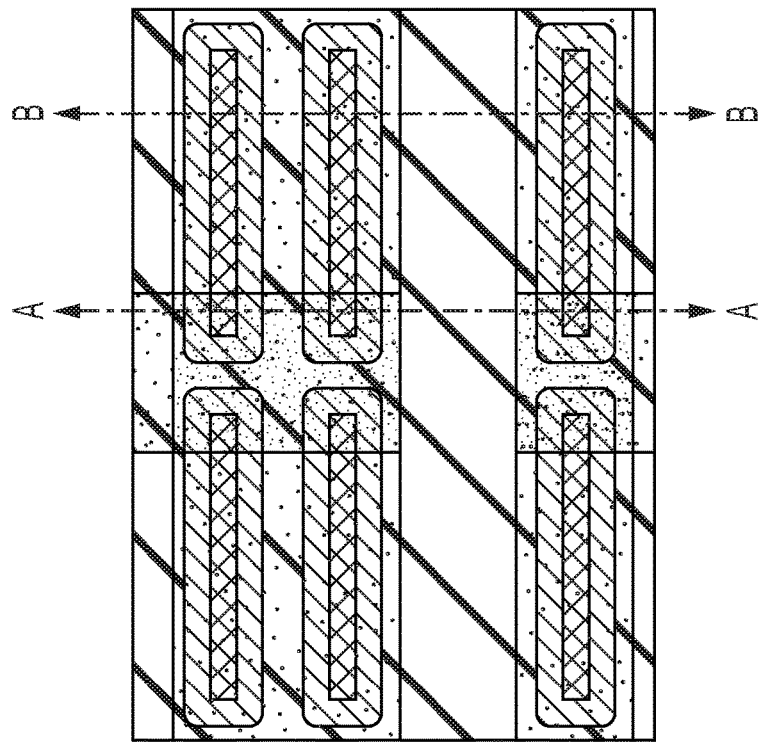
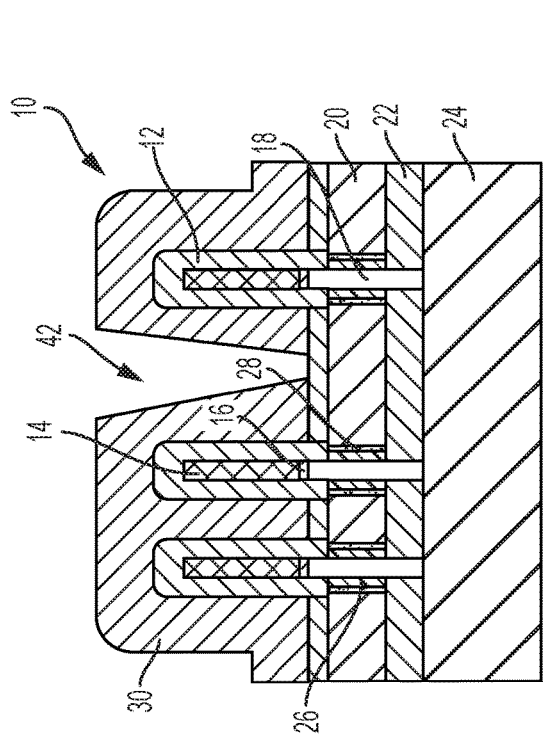
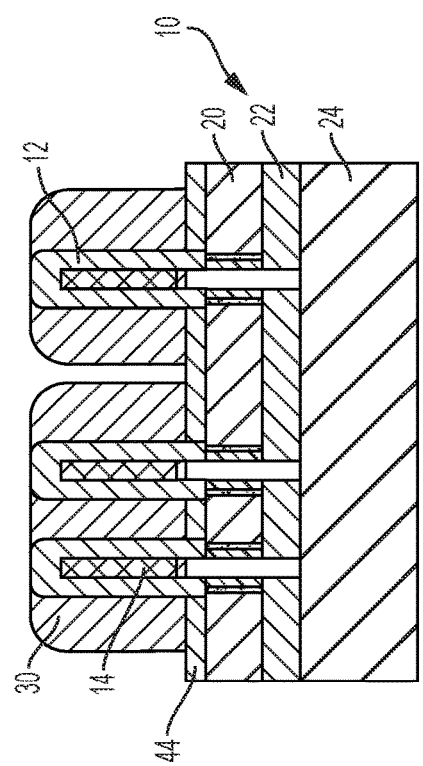

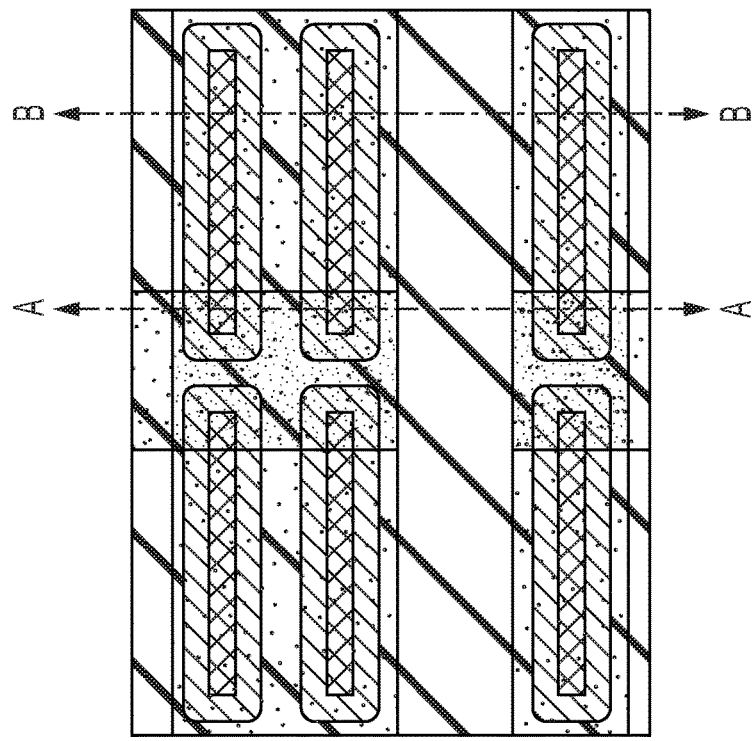
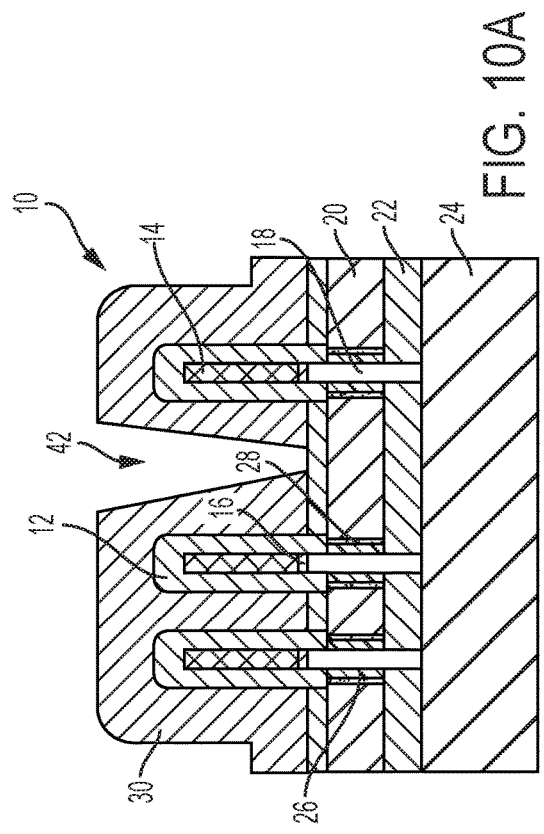
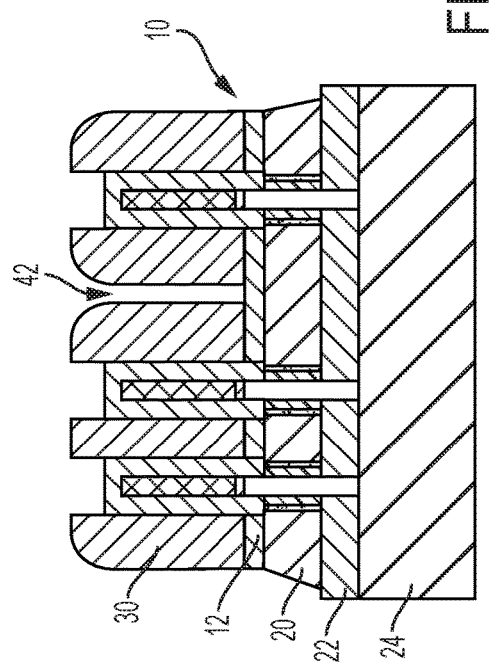
FIG. 10A
FIG. 10B
FIG. 10C

GATE CUT ON A VERTICAL FIELD EFFECT TRANSISTOR WITH A DEFINED-WIDTH INORGANIC MASK

BACKGROUND

The present invention relates to a method of cutting a gate on a vertical field effect transistor (VFET), and more specifically, to a method of cutting a gate on a VFET with a defined-width inorganic mask.

A metal-oxide-semiconductor field-effect transistor (MOSFET) is a transistor used for amplifying or switching electronic signals. The metal-oxide-semiconductor field-effect transistor has a source, a drain, and a metal oxide gate electrode. The metal gate is electrically insulated from the main semiconductor n-channel or p-channel by a thin layer of insulating material, for example, silicon dioxide or glass, which makes the input resistance of the metal-oxide-semiconductor field-effect transistor relatively high. The gate voltage controls whether the path from drain to source is an open circuit ("off") or a resistive path ("on").

N-type field effect transistors (NFET) and p-type field effect transistors (PFET) are two types of complementary metal-oxide-semiconductor field-effect transistor s. The N-type field effect transistor uses electrons as the majority current carriers and is built directly in a p substrate with n-doped source and drain junctions. The p-type field effect transistor uses holes as the majority current carriers and is built in an n-well with p-doped source and drain junctions.

The VFET is a type of metal-oxide-semiconductor field-effect transistor. The VFET contains a conformal gate around the fin that mitigates the effects of short channels and reduces drain-induced barrier lowering. "Vertical" or the "fin" refers to the narrow channel between source and drain regions. A thin insulating high-k gate oxide layer around the fin separates the fin channel from the gate metal.

SUMMARY

According to an embodiment of the present invention, a method of cutting a gate on a VFET includes depositing a memorization layer onto the VFET around a spacer on a sidewall of the field effect transistor. A planarizing layer is patterned onto the memorization layer. An anti-reflective coating layer is patterned onto the planarizing layer. A photoresist layer is patterned onto the anti-reflective coating layer on ends of fins extending from a substrate in the VFET. The planarizing layer, the anti-reflective coating layer, and the photoresist form a mask. The anti-reflective coating layer portion of the mask is etched from the VFET. The planarizing layer and the photoresist layer portions of the mask are arc etched from the VFET. The spacer is pulled down forming a void between gates on the VFET and exposing a hard mask on the fins. The hard mask is reactive ion etched by pulling down on the hard mask and reactive ion etching vertically around the gates to form gates with a defined width mask. The memorization layer is removed from the VFET.

According to an embodiment of the present invention, a VFET includes a first spacer disposed on a silicon substrate. A fin extending from the substrate through the spacer is included in the VFET. An oxide layer is disposed on the fin. A hard mask layer is disposed on the oxide layer. A second spacer with a defined width is disposed around the fin, oxide layer, and hard mask layer forming a gate around the fin.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2D is a cross-sectional illustration of a VFET 100 taken along line A-A in FIG. 2F.
FIG. 2E is a cross-sectional illustration of a VFET taken along line B-B in FIG. 2F.
FIG. 2F is a top view of a VFET.
FIG. 4A is a cross-sectional view of a VFET taken along line A-A in FIG. 4C.
FIG. 4B is a cross-sectional view of a VFET taken along B-B in FIG. 4C.
FIG. 4C is a top view of a VFET.
FIG. 5A is a cross-sectional view of a VFET taken along line A-A in FIG. 3C.
FIG. 5B is a cross-sectional view of a VFET taken along B-B in FIG. 5C.
FIG. 5C is a top view of a VFET.
FIG. 6A is a cross-sectional view of a VFET taken along line A-A in FIG. 6C.
FIG. 6B is a cross-sectional view of a VFET taken along B-B in FIG. 6C.
FIG. 6C is a top view of a VFET.
FIG. 7A is a cross-sectional view of a VFET taken along line A-A in FIG. 7C.
FIG. 7B is a cross-sectional view of a VFET taken along B-B in FIG. 7C.
FIG. 7C is a top view of a VFET.
FIG. 8A illustrates a cross-sectional view of a VFET taken along line A-A in FIG. 8B.
FIG. 8B is a top view of a VFET.
FIG. 9A is a cross-sectional view of a VFET taken along line A-A in FIG. 9C.
FIG. 9B is a cross-sectional view of a VFET taken along B-B in FIG. 9C.
FIG. 9C is a top view of a VFET.
FIG. 10A is a cross-sectional view of a VFET taken along line A-A in FIG. 10C.
FIG. 10B is a cross-sectional view of a VFET taken along B-B in FIG. 10C.
FIG. 10C is a top view of a VFET.

DETAILED DESCRIPTION

Figure 1:
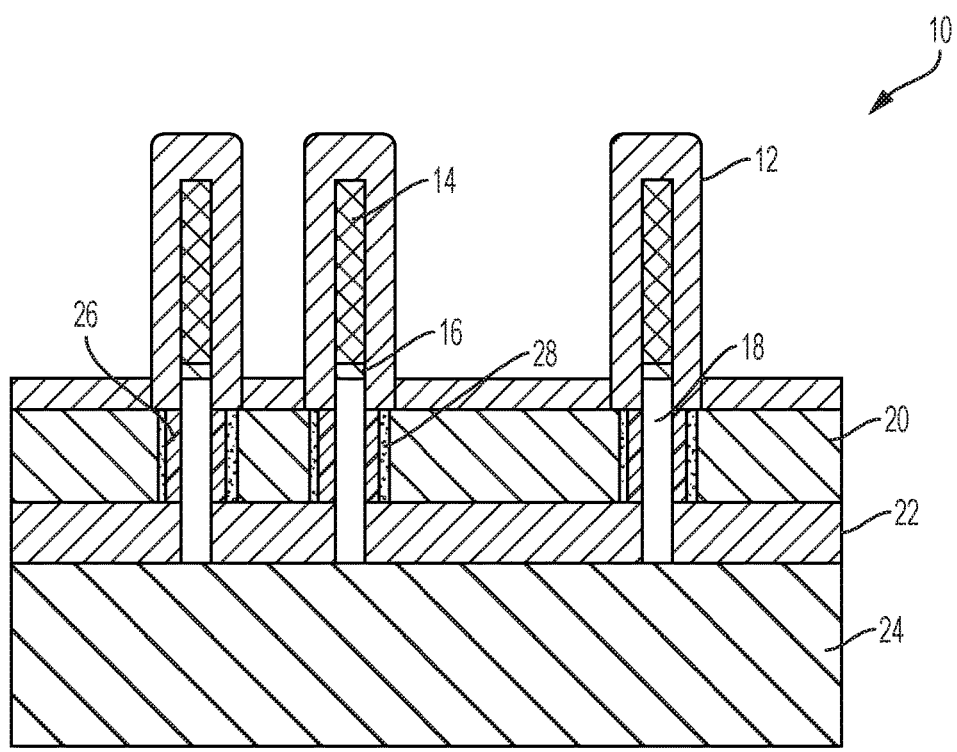
FIG. 1 is a cross-sectional illustration of a VFET.

For the sake of brevity, conventional techniques related to semiconductor device and integrated circuit (IC) fabrication may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments described herein will now be provided. Although specific fabrication operations used in implementing one or more embodiments described herein can be individually known, the described combination of operations and/or resulting structures described herein are unique. Thus, the unique combination of the operations described herein utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

A field effect transistor (FET) is a transistor using an electric field to control the shape and electrical conductivity of a channel of a type of a charge carrier in a semiconductor. Field effect transistors can have several forms, but all are known to have high input impedance (i.e., the measure of the opposition that a circuit presents to a current when a voltage is applied). The conductivity of a field effect transistor is regulated by the input current (i.e., emitter to base current) and so has low input impedance. A field effect transistor's conductivity is regulated by a voltage applied to a terminal (e.g., a gate) which is insulated from the device. The applied gate voltage imposes an electric field into the device, which then attracts or repels charge carriers to or from the region between a source terminal and a drain terminal. The density of charge carriers influences conductivity levels between the source terminal and the drain terminal. The size or length of the gate is the distance between the source terminal and the drain terminal. The width of the gate is generally defined as the extension of the transistor, in the direction perpendicular to the cross-section of the field effect transistor. Generally, the width is larger than the length of the gate.

Field effect transistors have high gate to main current resistance, greater than or equal to 100 MegaOhms which means that they can provide a high degree of isolation between control and flow. A field effect transistor generally generates less than a bipolar junction transistor because base current noise increases with shaping time. Field effect transistors can thus find use in sensitive electronics such as tuners and low-noise amplifiers for very high frequency (VHF) and satellite receivers. Field effect transistors are also relatively immune to radiation, exhibit no offset voltage at zero drain current and thus make an excellent signal chopper. Field effect transistors also generally have better thermal stability than a bipolar junction transistor because there is no additional power draw once the gate is opened or closed since field effect transistors are controlled by gate charge. Such a feature allows low-power switching, which allows greater miniaturization of circuits since heat dissipation needs are not as great.

Field effect transistors have low gain bandwidth product compared to bipolar junction transistors. Field effect transistors also have a very low "on" resistance and a very high "off" resistance. The intermediate resistances are significant so that field effect transistors can dissipate large amounts of power while switching. Switching quickly can cause transients that can excite stray inductances and generate significant voltages that can couple to the gate and cause unintentional switching. Field effect transistors can therefore require a very careful layout and can involve compromises between switching speed and power dissipation. There can also be compromises between voltage rating and "on" resistance wherein high voltage field effect transistors have a relatively high "on" resistance and thus, conduction losses as well.

The process flow for VFETs generally includes gate strapping with a mask. However, at the desired dimensions, a cut mask can be necessary in order to include the gate strapping features in the VFET. The cut mask cannot be incorporated by trilayer patterning given the requirements of incorporating a gate cut into the patterning flow.

Turning now to an overview of the present subject matter, one or more embodiments provide a methodology for a method and structure which uses an atomic layer deposition or atomic layer deposition-like oxide deposition process in order to allow the formation of the VFET gate strap. The method and structure described herein can also allow the implementation of a cut mask to provide accurate tip to tip dimensions between gate straps. The method and structure described herein allows for a defined width inorganic mask to be present on the VFET. The method and structure described herein allows for a defined width gate to be formed on the VFET structure.

With reference now to FIG. 1, a cross-sectional illustration of a VFET 10 is shown. In FIG. 1, a first spacer 22 extends from a substrate 24 with a fin 18 extending from the substrate 24. Initially, the fins 18 are patterned and etched into the substrate 24 and can be separated by shallow trench isolation regions. The fins 18 can be made of a substrate 24 comprising, for example, silicon, silicon germanium, other semiconductor materials, or a combination comprising at least one of the foregoing. The fin 18 can be surrounded by work function metal (WFM) layer 26 and a first oxide layer 28. Non-limiting examples of desirable work function metals can include aluminum, titanium, silver, copper, gold, or a combination comprising at least one of the foregoing. Non-limiting examples of gate metals include tungsten, tungsten titanium nitride, titanium, titanium nitride, tantalum, molybdenum, or any combination thereof. Both the work function metal layer 26 and the oxide layer 28 can include materials that will ensure the gate, once formed, is compatible with the fin 18. The fins 18 are oriented vertically with a gate 20 wrapping around the fins 18. An oxide layer 16 can extend from the fin 18 on the opposite end not connected to the substrate 24. A hard mask 14 can be deposited on the oxide layer 16 with a second spacer 12 deposited around each hard mask 14, oxide layer 16, and fin 18 structure. The hard mask 14 can include silicon nitride (SiN), SiOCN, SiBCN, or a combination comprising at least one of the foregoing.

Figure 2C:
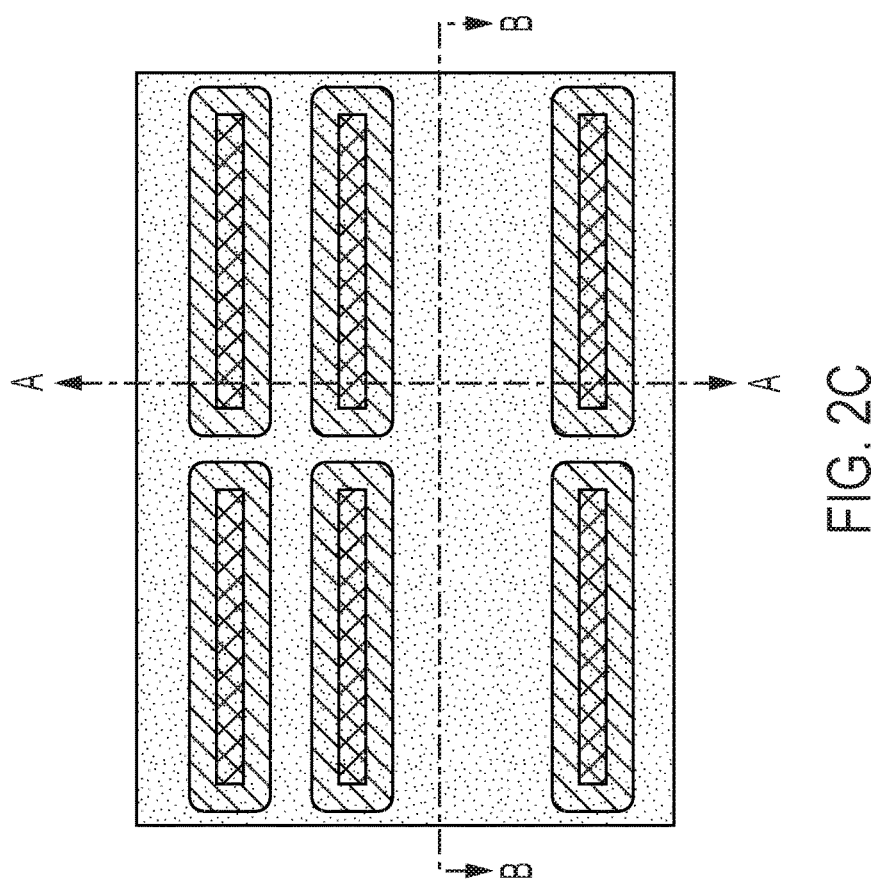
FIG. 2C is a top view of a VFET.
Figure 2A:
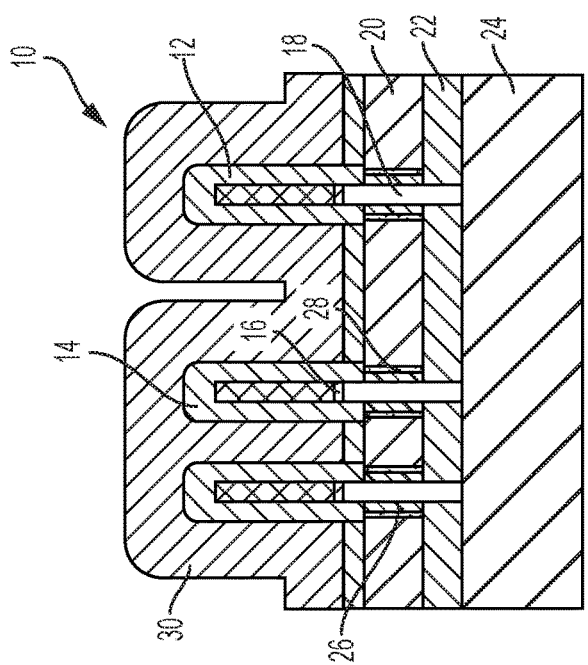
FIG. 2A is a cross-sectional view of a VFET taken along line A-A in FIG. 2C.
Figure 2B:
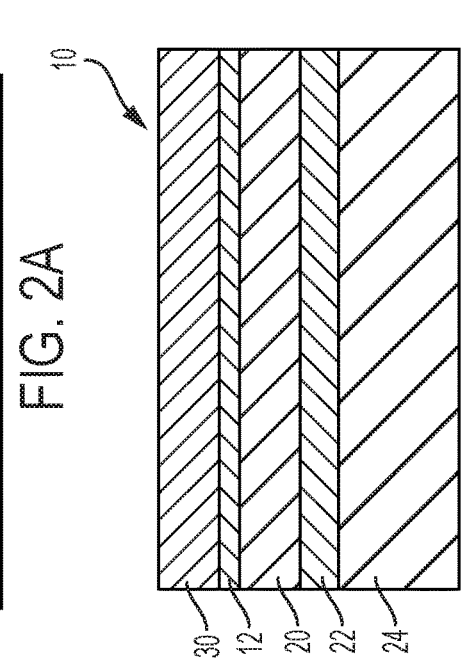
FIG. 2B is a cross-sectional view of a VFET taken along B-B in FIG. 2C.

FIG. 2A illustrates a cross-sectional view of the VFET 10 taken along line A-A in FIG. 2C, while FIG. 2B illustrates a cross-sectional view of the VFET 10 taken along B-B in FIG. 2C. In FIG. 2A, a memorization layer 30 can be deposited onto the VFET 10 around the second spacer 12. The memorization layer 30 can be deposited by atomic layer deposition or by an atomic layer deposition like process. The second spacer 12 can be located on a sidewall of the VFET 10. The memorization layer 30 can be applied with a defined width as illustrated in FIG. 2A. The memorization layer 30 can be applied without a defined width, i.e., the memorization layer 30 can be deposited as a pad of material which can allow for printing and cutting of the gate, but cannot control the width. An example is shown in FIGS. 2D and 2E, where FIG. 2D is a cross-sectional illustration of a VFET 100 taken along line A-A in FIG. 2F and FIG. 2E is a cross-sectional illustration of a VFET 100 taken along line B-B in FIG. 2F.

Figure 3C:
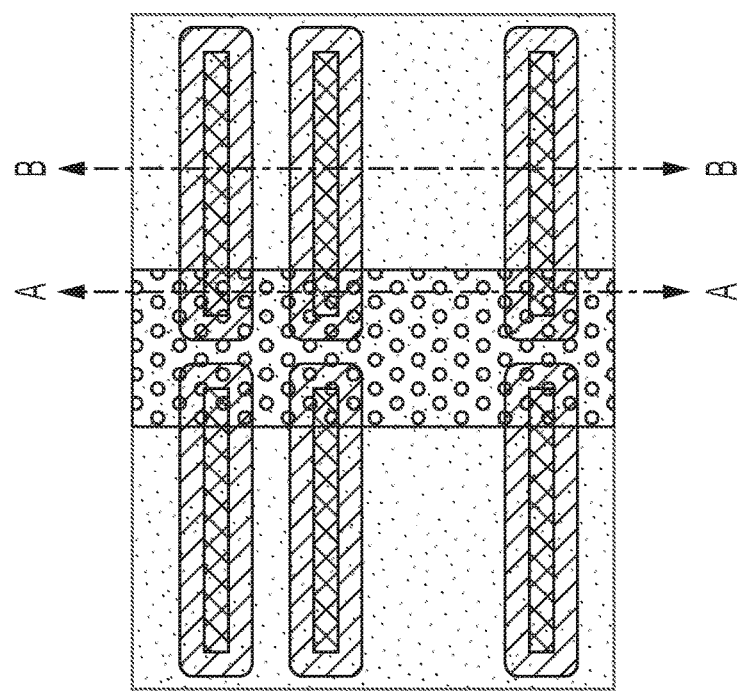
FIG. 3C is a top view of a VFET.
Figure 3A:
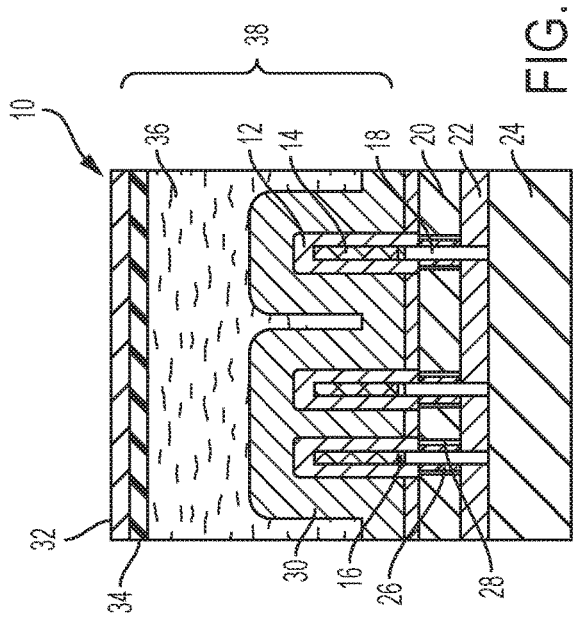
FIG. 3A is a cross-sectional view of a VFET taken along line A-A in FIG. 3C.
Figure 3B:
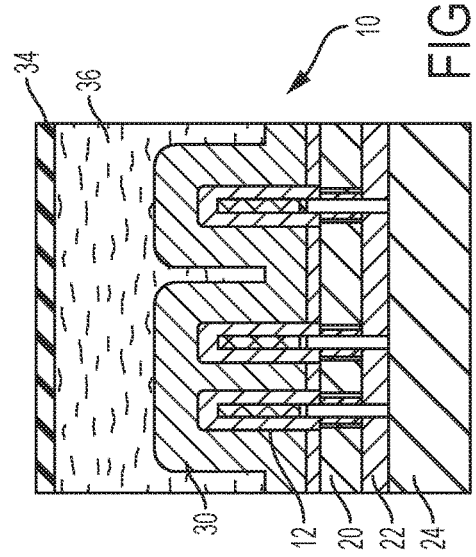
FIG. 3B is a cross-sectional view of a VFET taken along B-B in FIG. 3C.

FIG. 3A illustrates a cross-sectional view of the VFET 10 taken along line A-A in FIG. 3C, while FIG. 3B illustrates a cross-sectional view of the VFET 10 taken along B-B in FIG. 3C. In FIG. 3A, a planarizing layer 32 is patterned onto the memorization layer 30. Afterward, an anti-reflective coating layer 34 is patterned onto the planarizing layer 32. A photoresist layer 36 is then patterned onto the anti-reflective coating layer 34 on ends of the fins 18 extending from the substrate 24 in the VFET. The patterning can be accomplished by lithography. The planarizing layer 32, anti-reflective coating layer 34, and the photoresist layer 36 can form a mask 38. The planarizing layer 32 can be etched (e.g., plasma etched or arc etched) from the mask 38 as shown in FIG. 3B, with the anti-reflective coating layer 34 and the photoresist layer 36 still present on the VFET.

FIG. 4A illustrates a cross-sectional view of the VFET 10 taken along line A-A in FIG. 4C, while FIG. 4B illustrates a cross-sectional view of the VFET 10 taken along B-B in FIG. 4C. In FIG. 4A, the anti-reflective coating layer 34 is being etched (e.g., arc etched) from the photoresist layer 36 and the photoresist layer 36 is being etched (e.g., arc etch or plasma etched) from the memorization layer 30 as shown in FIG. 4B.

FIG. 5A illustrates a cross-sectional view of the VFET 10 taken along line A-A in FIG. 3C, while FIG. 5B illustrates a cross-sectional view of the VFET 10 taken along B-B in FIG. 5C. In FIG. 5A, the gate cut is demonstrated. In FIG. 5A, the memorization layer 30 is being pulled down and away from the sidewall of the VFET 10. FIG. 5B shows the VFET 10 with the memorization layer 30 pulled down to the same height as the hard mask 14 formed around the fins 18 and gates 20. Stated another way, the memorization layer 30 can be reactive ion etched anisotropically from the VFET 10.

FIG. 6A illustrates a cross-sectional view of the VFET 10 taken along line A-A in FIG. 6C, while FIG. 6B illustrates a cross-sectional view of the VFET 10 taken along B-B in FIG. 6C. In FIGS. 6A and 6B, the mask is being cut. As demonstrated in FIG. 6A, a pad 40 of the mask 38 can be cut away to expose a portion of the photoresist layer 36. In FIG. 6B, the planarizing layer 32 has been etched away and the memorization layer 30 has been pulled down to the same height as the hard mask 14 formed around the fins 18 and the gates 20.

FIG. 7A illustrates a cross-sectional view of the VFET 10 taken along line A-A in FIG. 7C, while FIG. 7B illustrates a cross-sectional view of the VFET 10 taken along B-B in FIG. 7C. In FIG. 7A, the anti-reflective coating layer 34 and the photoresist layer 36 are reactive ion etched in the pad region 40 to create an opening 42 in the portion of the VFET 10 where it is desired to cut the mask 38. In FIG. 7B, the memorization layer 30 has been pulled down to the same height as the hard mask 14 formed around the fins 18 and the gates 20.

FIG. 8A illustrates a cross-sectional view of the VFET 10 taken along line A-A in FIG. 8B. FIG. 8A is another view of the reactive ion etching processing to form the opening 42 in the VFET 10. In FIG. 8A, the anti-reflective coating layer 34 and the photoresist layer 36 are pulled down as far as possible to create the opening 42. As can be seen in FIG. 8A, the anti-reflective coating layer 34 and the photoresist layer 36 are pulled down to below the oxide layer 16.

FIG. 9A illustrates a cross-sectional view of the VFET 10 taken along line A-A in FIG. 9C, while FIG. 9B illustrates a cross-sectional view of the VFET 10 taken along B-B in FIG. 9C. FIG. 9A and FIG. 9B show the memorization layer 30 being pulled away from a sidewall 44 of the VFET 10. The memorization layer is also being pulled vertically downward to match the height of the hard mask 14. FIG. 9B shows the structure with the memorization layer 30 pulled away from the sidewall 44 and down to the hard mask 14 with opening 42 present between gates and the memorization layer etched down to the hard mask 14.

FIG. 10A illustrates a cross-sectional view of the VFET 10 taken along line A-A in FIG. 10C, while FIG. 10B illustrates a cross-sectional view of the VFET 10 taken along B-B in FIG. 10C. In FIG. 10A, the second spacer 14 is pulled down to a height below the memorization layer 30. The result is shown in FIG. 10B. In FIG. 10B, the gate 20 is pulled away from the first spacer 22 to define the gate 20. For example, the hard mask 14 can be reactive ion etched by pulling down on the hard mask 14. The material around the gates 20 can be reactive ion etched vertically around the gates 20 to form gates 20 with a defined width mask as shown in FIG. 10B.

Figure 11C:
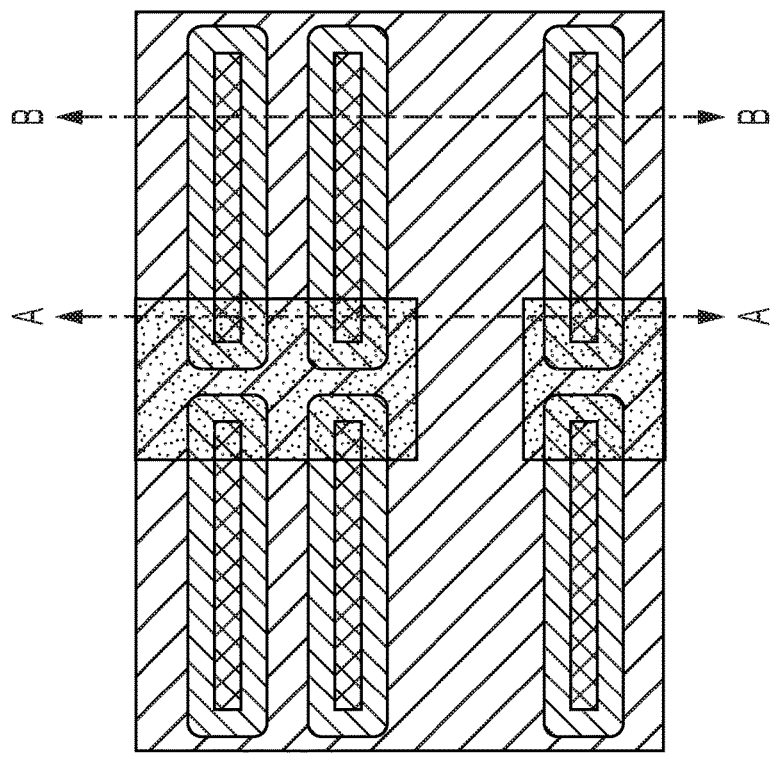
FIG. 11C is a top view of a VFET.
Figure 11A:
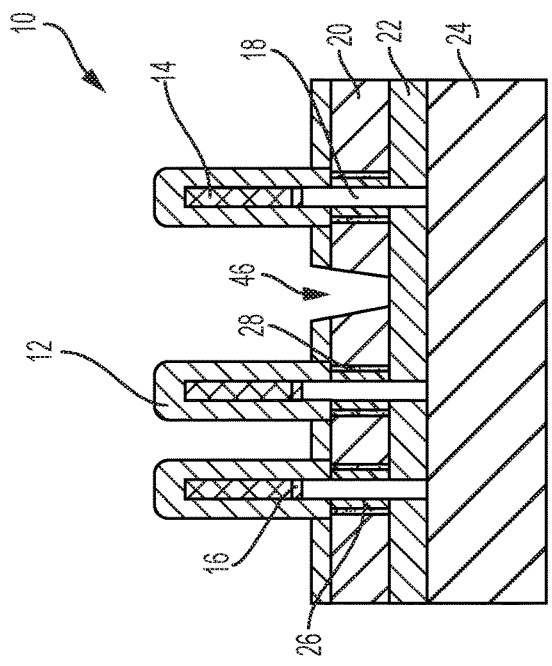
FIG. 11A is a cross-sectional view of a VFET taken along line A-A in FIG. 11C.
Figure 11B:
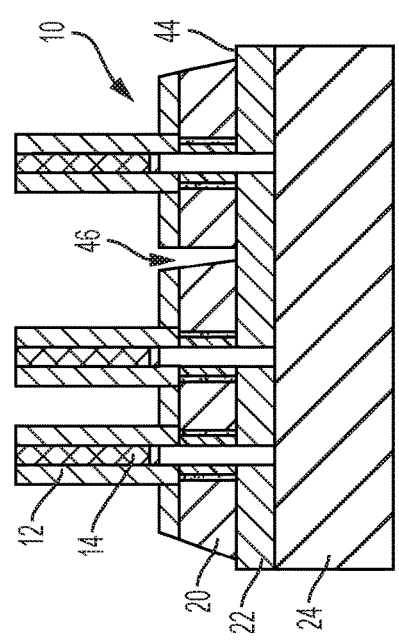
FIG. 11B is a cross-sectional view of a VFET taken along B-B in FIG. 11C.

FIG. 11A illustrates a cross-sectional view of the VFET 10 taken along line A-A in FIG. 11C, while FIG. 11B illustrates a cross-sectional view of the VFET 10 taken along B-B in FIG. 11C. To form the final VFET structure 10, the memorization layer 30 is removed from the structure and gate cut 46 cut into the gate 20. The memorization layer 30 can be removed with an acidic material, e.g., hydrofluoric acid (HF) and can be removed by buffering with the hydrofluoric acid. In FIG. 11A, the memorization layer 30 has been removed and a gate cut 46 is cut into the gate 20. In FIG. 11B, the gate 20 has been etched away from sidewall 44 of first spacer 22 to form a VFET 10 with a defined with gate 20.

The memorization layer can comprise any material that will provide the desired properties. For example, the memorization layer can include an oxide. The fins can be surrounded by an oxide layer. The hard mask can include an inorganic hard mask, e.g., silicon nitride. The gate can have a defined width of 1 nanometer to 50 nanometers. The anti-reflective coating can include silicon. The photoresist can cover the ends of the fins allowing the memorization layer to remain when the mask is etched from the VFET. The reactive ion etching described herein can be accomplished by etching vertically across the fins.

A VFET as described herein can include a first spacer disposed on a silicon substrate, a fin extending from the substrate through the spacer, an oxide layer disposed on the fin, a hard mask layer disposed on the oxide layer; and a second spacer with a defined width disposed around the fin, oxide layer, and hard mask layer to form a gate around the fin. The first spacer and/or the second spacer can include an insulating material. For example, the insulating material can include silicon nitride. The gate can include a metal, e.g., tungsten. The hard mask can include a non-conducting material such as silicon nitride. The gate around the fin can have a defined thickness, e.g., 1 nanometer to 50 nanometers. A distance between gates across the VFET can be consistent.

Various embodiments are described herein with reference to the related drawings. Alternative embodiments can be devised without departing from the scope of the subject matter described herein. It is noted that various connections and positional relationships (e.g., over, below, adjacent, etc.) are set forth between elements in the following description and in the drawings. These connections and/or positional relationships, unless specified otherwise, may be direct or indirect, and the present subject matter is not intended to be limiting in this respect. Accordingly, a coupling of entities may refer to either a direct or an indirect coupling, and a positional relationship between entities may be a direct or indirect positional relationship. As an example of an indirect positional relationship, references in the present application to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" can include both an indirect "connection" and a direct "connection."

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of cutting a gate on a vertical field effect transistor (VFET), comprising:
    depositing a memorization layer onto the VFET around a spacer on a sidewall of the field effect transistor;
    patterning a planarizing layer onto the memorization layer;
    patterning an anti-reflective coating layer onto the planarizing layer;

patterning a photoresist layer onto the anti-reflective coating on ends of fins extending from a substrate in the VFET, wherein the planarizing layer, the anti-reflective coating layer, and the photoresist form a mask;

etching the anti-reflective coating layer portion of the mask from the VFET;

arc etching the planarizing layer and the photoresist layer portions of the mask from VFET;

pulling down the spacer forming a void between gates on the VFET and exposing a hard mask on the fins;

reactive ion etching the hard mask by pulling down on the hard mask and reactive ion etching vertically around the gates to form gates with a defined width mask; and removing the memorization layer from the VFET.

2. The method of claim 1, wherein the depositing of the memorization layer is done through atomic layer deposition.

3. The method of claim 1, wherein the memorization layer has a defined width.

4. The method of claim 1, wherein the memorization layer comprises oxide.

5. The method of claim 1, wherein the fins are surrounded by an oxide layer.

6. The method of claim 1, wherein the hard mask on the fins comprises an inorganic hard mask.

7. The method of claim 6, wherein the hard mask comprises silicon nitride.

8. The method of claim 1, wherein the gate has a width of 1 nanometer to 50 nanometers.

9. The method of claim 1, wherein the anti-reflective coating comprises silicon.

10. The method of claim 1, wherein the photoresist covers the ends of the fins allowing the memorization layer to remain when the mask is etched from the VFET.

11. The method of claim 1, wherein the reactive ion etching is done vertically across the fins.

12. The method of claim 1, wherein removing the memorization layer from the VFET includes buffering with an acid to remove the memorization layer.

* * * * *